(12) United States Patent
Matsuzaki

(10) Patent No.: US 8,513,977 B2
(45) Date of Patent: Aug. 20, 2013

(54) DATA HOLDING CIRCUIT

(75) Inventor: Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 752 days.

(21) Appl. No.: 12/683,776

(22) Filed: Jan. 7, 2010

(65) Prior Publication Data

US 2010/0181384 A1 Jul. 22, 2010

(30) Foreign Application Priority Data

Jan. 22, 2009 (JP) ................... 2009-012050

(51) Int. Cl.
*H01L 25/00* (2006.01)
*H03K 19/00* (2006.01)

(52) U.S. Cl.
USPC ............................................ 326/101; 326/46

(58) Field of Classification Search
None
See application file for complete search history.

(56) References Cited

U.S. PATENT DOCUMENTS

| | | | |
|---|---|---|---|
| 4,585,956 A | 4/1986 | Lie | |
| 4,691,125 A | 9/1987 | Rybicki | |
| 5,075,166 A | 12/1991 | Sikorski et al. | |
| 5,291,074 A | 3/1994 | Nayebi | |
| 5,481,212 A * | 1/1996 | Shima | 327/94 |
| 5,597,631 A | 1/1997 | Furumoto et al. | |
| 5,673,219 A | 9/1997 | Hashimoto | |
| 5,770,313 A | 6/1998 | Furumoto et al. | |
| 5,847,413 A | 12/1998 | Yamazaki et al. | |
| 6,198,652 B1 | 3/2001 | Kawakubo et al. | |
| 6,224,965 B1 | 5/2001 | Haas et al. | |
| 6,403,221 B1 | 6/2002 | Nakamura et al. | |
| 6,530,147 B1 | 3/2003 | Haas et al. | |
| 6,625,056 B1 | 9/2003 | Kihara | |
| 6,765,253 B2 | 7/2004 | Nakashima | |
| 6,805,958 B2 | 10/2004 | Nakamura et al. | |
| 6,942,155 B1 | 9/2005 | Stewart et al. | |
| 7,061,083 B1 | 6/2006 | Usami et al. | |
| 7,215,251 B2 | 5/2007 | Hyde | |
| 2004/0016118 A1 | 1/2004 | Haas et al. | |
| 2004/0051391 A1 | 3/2004 | O'Shaughnessy | |

(Continued)

FOREIGN PATENT DOCUMENTS

| | | |
|---|---|---|
| EP | 0107337 A2 | 5/1984 |
| EP | 1 092 739 A1 | 4/2001 |

(Continued)

OTHER PUBLICATIONS

European Search Report (Application No. 10150395.1) dated Nov. 18, 2011, in English.

*Primary Examiner* — Jany Richardson
(74) *Attorney, Agent, or Firm* — Fish & Richardson P.C.

(57) ABSTRACT

A semiconductor device which stores data, and in which refresh operation is not needed, is described. The semiconductor device comprises at least a transistor and a capacitor. A first electrode of the capacitor is connected to a reference voltage terminal and a second electrode of the capacitor is connected to one of a source and a drain of the transistor. The semiconductor device is configured to put, when necessary, the other of the source and the drain of the transistor to the same potential as the one of the source and the drain, so that charge accumulated in the capacitor, which is connected to the one of the source and the drain of the transistor, does not leak through the transistor.

15 Claims, 17 Drawing Sheets

(56) References Cited

U.S. PATENT DOCUMENTS

| | | |
|---|---|---|
| 2005/0233122 A1 | 10/2005 | Nishimura et al. |
| 2006/0105153 A1 | 5/2006 | Jang et al. |
| 2006/0128345 A1 | 6/2006 | Ootaka et al. |
| 2006/0250220 A1 | 11/2006 | Stewart |
| 2007/0020932 A1 | 1/2007 | Maruyama et al. |
| 2007/0278563 A1 | 12/2007 | Takano et al. |
| 2008/0012126 A1 | 1/2008 | Dozen et al. |
| 2008/0083954 A1 | 4/2008 | Tokunaga |
| 2008/0224940 A1 | 9/2008 | Sugiyama et al. |
| 2008/0224941 A1 | 9/2008 | Sugiyama et al. |
| 2008/0242005 A1 | 10/2008 | Dozen et al. |
| 2008/0311706 A1 | 12/2008 | Dozen et al. |
| 2010/0085792 A1 | 4/2010 | Matsuzaki |

FOREIGN PATENT DOCUMENTS

| | | |
|---|---|---|
| JP | 57-203296 A | 12/1982 |
| JP | 05-190582 A | 7/1993 |
| JP | 06-318399 A | 11/1994 |
| JP | 08-213909 A | 8/1996 |
| JP | 2002-198658 A | 7/2002 |
| JP | 2004-078991 A | 3/2004 |
| JP | 2004-079843 A | 3/2004 |
| JP | 2004-362341 A | 12/2004 |
| JP | 2006-155247 A | 6/2006 |
| JP | 2006-222462 A | 8/2006 |
| JP | 2007-091822 A | 4/2007 |
| JP | 2008-112988 A | 5/2008 |
| JP | 2008-123074 A | 5/2008 |
| WO | 2008/041716 A1 | 4/2008 |

* cited by examiner

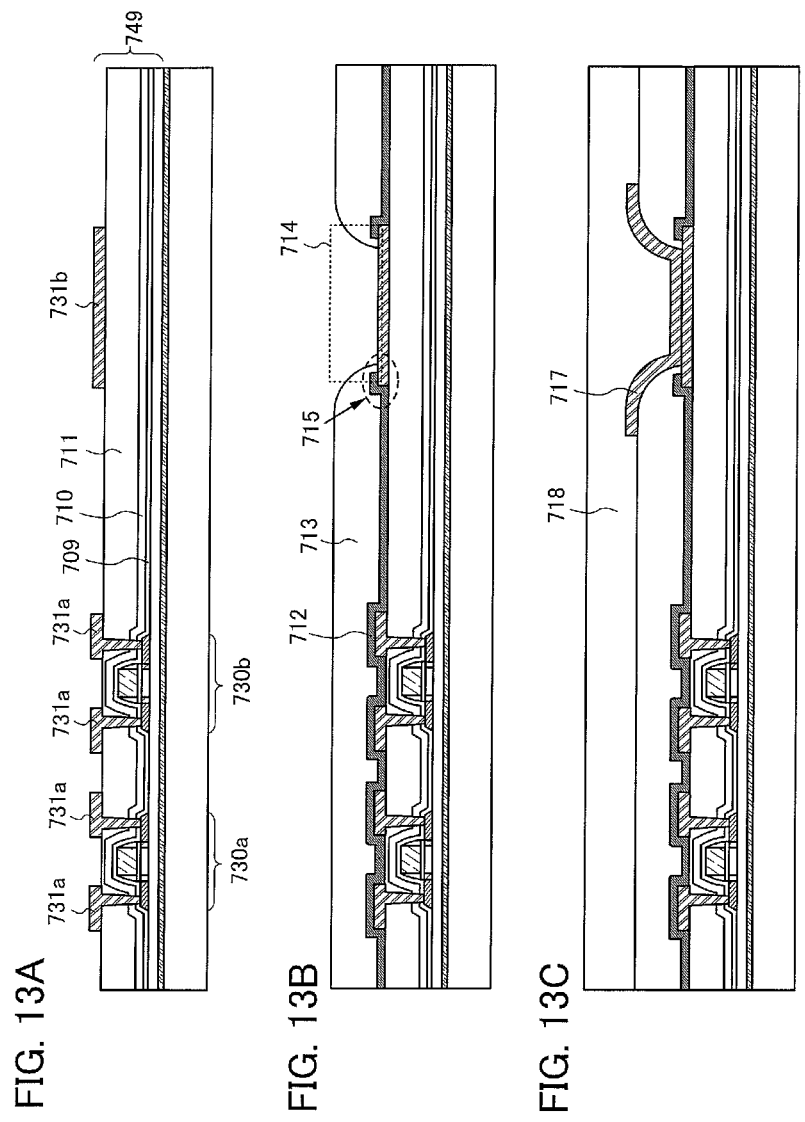

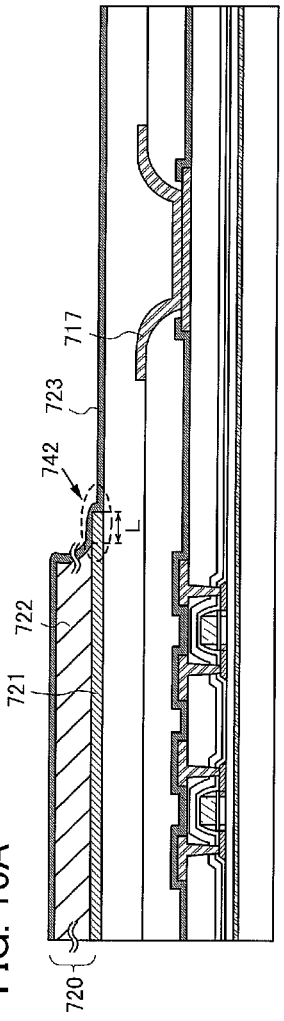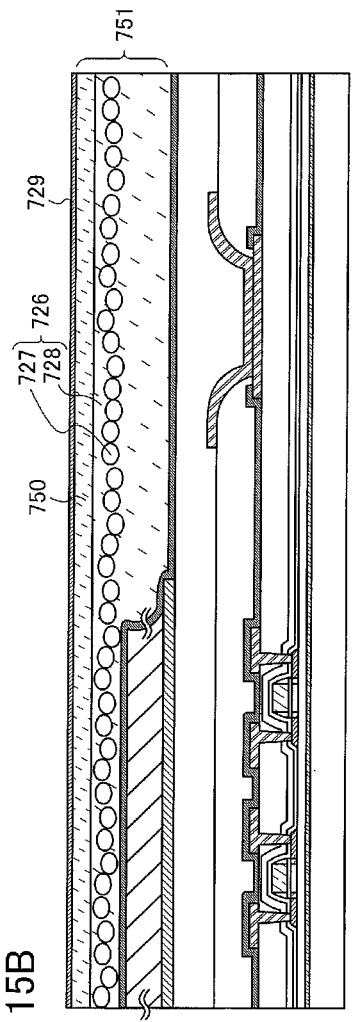

DATA HOLDING CIRCUIT

BACKGROUND OF THE INVENTION

1. Field of the Invention

The present invention relates to semiconductor devices. Alternatively, the present invention relates to wireless tags (also referred to as RFID tags, IC tags, or ID tags) utilizing a radio frequency identification (RFID) technology.

2. Description of the Related Art

RFID is widely used as an automatic identification technology by which data can be transmitted and received wirelessly. RFID includes an RFID tag which can store data and a reader/writer which performs reading of data stored in the RFID and writing of data to the RFID tag. An RFID tag includes, for example, a semiconductor device including an antenna and the like.

An RFID tag is provided with a session flag (Patent document 1). The session flag prevents additional reading of data after the data is read from the RFID tag. For example, the session flag has two kinds of states of "A" and "B" and the state is set from "A" to "B" when data is read out.

After data is read and the state of a session flag is set from "A" to "B", a memory provided in the RFID tag holds the state of the session flag even when an electric wave is temporarily interrupted. Even if the RFID tag receives an electric wave, the RFID tag is "already read out" because the session flag is in the state "B." Therefore, additional reading of the data stored in the RFID tag, which has already been read out is prevented.

Usually, a memory includes a transistor and a capacitor, and charge is accumulated in the capacitor to store data. However, charge accumulated in a capacitor leaks due to various causes. A major cause of leakage current is quantum tunneling. Accordingly, refresh operation is needed. Note that refresh operation is operation in which data is rewritten to a memory by accumulating charge on the basis of data which is stored in the memory and read out from the memory before charge is completely lost.

REFERENCE

[Patent Document 1] Japanese Published Patent Application No. 2006-155247

SUMMARY OF THE INVENTION

It is an object in an embodiment of the present invention to provide a semiconductor device which stores data with a transistor and a capacitor and which does not need refresh operation.

An embodiment of the present invention is an RFID tag which includes a transistor and a capacitor connected to one of a source and a drain of the transistor, and which applies voltage corresponding to charge accumulated in the capacitor to the other of the source and the drain of the transistor. The charge accumulated is held in the capacitor without leakage through the other of the source and the drain of the transistor.

An embodiment of the present invention is an RFID tag including a first transistor, a second transistor, a third transistor, a capacitor, and a buffer. One of a source and a drain of the second transistor is electrically connected to an input terminal. The other of the source and the drain of the second transistor is electrically connected to one of a source and a drain of the first transistor and one of a source and a drain of the third transistor. The other of the source and the drain of the first transistor is electrically connected to one electrode of the capacitor and an input of the buffer. The other electrode of the capacitor is electrically connected to a reference voltage terminal. An output of the buffer is electrically connected to an output terminal and the other of the source and the drain of the third transistor.

The second transistor and the first transistor are turned on, charge is accumulated in the capacitor from the input terminal, and data corresponding to the charge is outputted from the buffer to the output terminal. After the charge is accumulated, the second transistor and the first transistor are turned off and the third transistor is turned on, and an output from the buffer is applied to one of the source and the drain of the first transistor, so that the charge accumulated in the capacitor is held in the capacitor without leakage through one of the source and the drain of the first transistor.

The second transistor and the first transistor are turned on, the charge accumulated in the capacitor is released to one of the source and the drain of the first transistor, and data corresponding to release of the charge is outputted from the buffer to the output terminal. After the charge is accumulated, the second transistor and the first transistor are turned off and the third transistor is turned on, and the output from the buffer is applied to one of the source and the drain of the first transistor.

An embodiment of the present invention is an RFID tag including a first inverter, a second inverter, a first transistor, a capacitor, a buffer, a first analog switch, a second analog switch, a first input terminal, a second input terminal, and an output terminal. The first input terminal is electrically connected to an input of the first inverter. An output of the first inverter is electrically connected to an input of the second inverter, a second control terminal of the first analog switch, and a first control terminal of the second analog switch. An output of the second inverter is electrically connected to a first control terminal of the first analog switch, a second control terminal of the second analog switch, and a gate of the first transistor. The second input terminal is electrically connected to an input of the first analog switch. An output of the first analog switch is electrically connected to one of a source and a drain of the first transistor and an output of the second analog switch. The other of the source and the drain of the first transistor is electrically connected to one electrode of the capacitor and an input of the buffer. The other electrode of the capacitor is electrically connected to a reference voltage terminal. An output of the buffer is electrically connected to the output terminal and an input of the second analog switch.

Outputs from the first inverter and the second inverter, which are obtained by inputting a signal to the first inverter from the first input terminal, turn on the first analog switch and the first transistor and turn off the second analog switch, charge is accumulated in the capacitor from the second input terminal, and data corresponding to the charge is outputted to the output terminal from the buffer. After the charge is accumulated, outputs from the first inverter and the second inverter, which are obtained by inputting a signal to the first inverter from the first input terminal, turn off the first analog switch and the first transistor and turn on the second analog switch, and an output from the buffer is applied to one of the source and the drain of the first transistor, so that the charge accumulated in the capacitor is held in the capacitor without leakage through one of a source and a drain of the first transistor.

Outputs from the first inverter and the second inverter, which are obtained by inputting a signal to the first inverter from the first input terminal, turn on the first analog switch and the first transistor and turn off the second analog switch, charge accumulated in the capacitor is released to one of the source and the drain of the first transistor, and data corresponding to release of the charge is outputted to the output terminal from the buffer. After the charge is released, outputs from the first inverter and the second inverter, which are obtained by inputting a signal to the first inverter from the first input terminal, turn off the first analog switch and the first transistor and turn on the second analog switch, and an output from the buffer is applied to one of the source and the drain of the first transistor.

An embodiment of the present invention is an RFID tag including an antenna, a rectifier circuit, a logic portion, and a flag holding circuit. The antenna is connected to the rectifier circuit. The rectifier circuit is connected to the logic portion and the flag holding circuit. The logic portion includes a clock circuit, a logic circuit, a demodulation circuit, and a modulation circuit. The flag holding circuit includes a first transistor, a second transistor, a third transistor, a capacitor, and a buffer. A gate of the second transistor is electrically connected to the logic circuit. One of a source and a drain of the second transistor is electrically connected to an input terminal. The other of the source and the drain of the second transistor is electrically connected to one of a source and a drain of the first transistor and one of a source and a drain of the third transistor. A gate of the first transistor is electrically connected to the logic circuit. The other of the source and the drain of the first transistor is electrically connected to one electrode of the capacitor and an input of the buffer. The other electrode of the capacitor is electrically connected to a reference voltage terminal. An output of the buffer is electrically connected to an output terminal and the other of the source and the drain of the third transistor. A gate of the third transistor is electrically connected to the logic circuit.

The rectifier circuit supplies power supply voltage to the logic portion and the flag holding circuit.

The second transistor and the first transistor are turned on, charge based on a signal received by the antenna is accumulated in the capacitor from the input terminal, and data corresponding to the charge is outputted from the buffer to the output terminal. After the charge is accumulated, the second transistor and the first transistor are turned off and the third transistor is turned on, and an output from the buffer is applied to one of the source and the drain of the first transistor, so that the charge accumulated in the capacitor is held in the capacitor without leakage through one of the source and the drain of the first transistor.

The second transistor and the first transistor are turned on, the charge accumulated in the capacitor is released to one of the source and the drain of the first transistor, and data corresponding to release of the charge is outputted from the buffer to the output terminal. After the charge is accumulated, the second transistor and the first transistor are turned off and the third transistor is turned on, and the output from the buffer is applied to one of the source and the drain of the first transistor.

An embodiment of the present invention is an RFID tag including an antenna, a rectifier circuit, a logic portion, and a flag holding circuit. The antenna is connected to the rectifier circuit. The rectifier circuit is connected to the logic portion and the flag holding circuit. The logic portion includes a clock circuit, a logic circuit, a demodulation circuit, and a modulation circuit. The flag holding circuit includes a first inverter, a second inverter, a first transistor, a capacitor, a buffer, a first analog switch, a second analog switch, a first input terminal, a second input terminal, and an output terminal. The antenna is electrically connected to the second input terminal. The first input terminal is electrically connected to an input of the first inverter. An output of the first inverter is electrically connected to an input of the second inverter, a second control terminal of the first analog switch, and a first control terminal of the second analog switch. An output of the second inverter is electrically connected to a first control terminal of the first analog switch, a second control terminal of the second analog switch, and a gate of the first transistor. The second input terminal is electrically connected to an input of the first analog switch. An output of the first analog switch is electrically connected to one of a source and a drain of the first transistor and an output of the second analog switch. The other of the source and the drain of the first transistor is electrically connected to one electrode of the capacitor and an input of the buffer. The other electrode of the capacitor is electrically connected to a reference voltage terminal. An output of the buffer is electrically connected to the output terminal and an input of the second analog switch.

The rectifier circuit supplies power supply voltage to the logic portion and the flag holding circuit.

Outputs from the first inverter and the second inverter, which are obtained by inputting a signal to the first inverter from the first input terminal, turn on the first analog switch and the first transistor and turn off the second analog switch, charge based on a signal received by the antenna is accumulated in the capacitor from the second input terminal, and data corresponding to the charge is outputted to the output terminal from the buffer. After the charge is accumulated, outputs from the first inverter and the second inverter, which are obtained by inputting a signal to the first inverter from the first input terminal, turn off the first analog switch and the first transistor and turn on the second analog switch, and an output from the buffer is applied to one of the source and the drain of the first transistor, so that the charge accumulated in the capacitor is held in the capacitor without leakage through one of a source and a drain of the first transistor.

Outputs from the first inverter and the second inverter, which are obtained by inputting a signal to the first inverter from the first input terminal, turn on the first analog switch and the first transistor and turn off the second analog switch, charge accumulated in the capacitor is released to one of the source and the drain of the first transistor, and data corresponding to release of the charge is outputted to the output terminal from the buffer. After the charge is released, outputs from the first inverter and the second inverter, which are obtained by inputting a signal to the first inverter from the first input terminal, turn off the first analog switch and the first transistor and turn on the second analog switch, and an output from the buffer is applied to one of the source and the drain of the first transistor.

According to an embodiment of the present invention, data can be stored with a transistor and a capacitor, and can be held without requiring refresh operation.

BRIEF DESCRIPTION OF THE DRAWINGS

In the accompanying drawings:

FIGS. 13A, 13B, and 13C are diagrams illustrating Embodiment 5 of the present invention;

FIGS. 15A and 15B are diagrams illustrating Embodiment 5 of the present invention;

DETAILED DESCRIPTION OF THE INVENTION

Figure 1A:
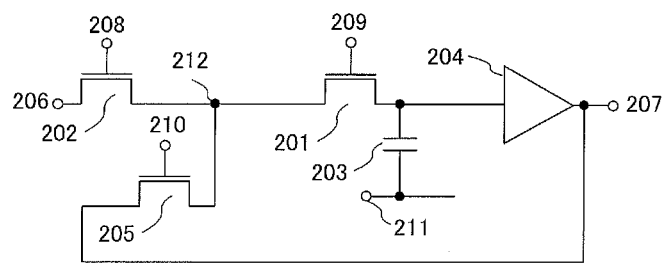
FIGS. 1A and 1B are diagrams each illustrating Embodiment 1 of the present invention.

Embodiments of the present invention will be described below with reference to the drawings. Reference numerals which denote the same parts are used in common in different drawings.

Embodiment 1

An RFID tag disclosed in this embodiment includes a circuit including a first transistor 201, a second transistor 202, a capacitor 203, a buffer 204, and a third transistor 205 (FIG. 1A). Reference numerals 206 and 207 show an input terminal and an output terminal respectively. Reference numerals 208 to 210 each denote a control terminal. Reference numeral 211 shows a reference voltage terminal.

Figure 1B:
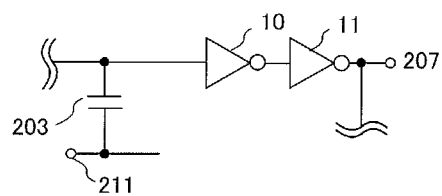

The first transistor 201, the second transistor 202, and the third transistor 205 are n-channel transistors or p-channel transistors. The buffer 204 is, for example, a circuit in which a first inverter 10 and a second inverter 11 are connected in series (FIG. 1B).

A gate of the second transistor 202 is electrically connected to the control terminal 208. One of a source and a drain of the second transistor 202 is electrically connected to the input terminal 206. The other of the source and the drain of the second transistor 202 is electrically connected to one of a source and a drain of the first transistor 201 and one of a source and a drain of the third transistor 205.

A gate of the first transistor 201 is electrically connected to the control terminal 209. The other of the source and the drain of the first transistor 201 is electrically connected to one electrode of the capacitor 203 and an input of the buffer 204.

The other electrode of the capacitor 203 is electrically connected to the reference voltage terminal 211.

An output of the buffer 204 is electrically connected to the output terminal 207 and the other of the source and the drain of the third transistor 205.

A gate of the third transistor 205 is electrically connected to the control terminal 210.

Next, operation an RFID tag is described. In this embodiment, data "1" represents high voltage and data "0" represents low voltage.

(Initial State)

Figure 2:
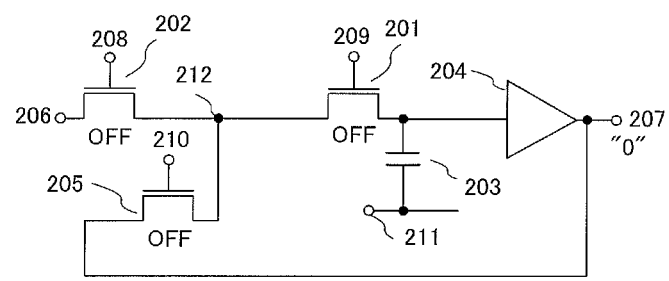
FIG. 2 is a diagram illustrating Embodiment 1 of the present invention.

In an initial state, the first transistor 201, the second transistor 202, and the third transistor 205 are off. Charge is not accumulated in the capacitor 203. An output from the buffer 204 is "0" and output data from the output terminal 207 is "0" (FIG. 2).

(The Case where Output Data is Set to be "1")

The case where charge is accumulated in the capacitor 203 to set the output of the buffer 204 is set to be "1" and output data of the output terminal 207 is set to be "1" is described.

The second transistor 202 is turned on by voltage from the control terminal 208. Further, the first transistor 201 is turned on by voltage from the control terminal 209. Then, current corresponding to high voltage "1" flows from the input terminal 206 and charge is accumulated in the capacitor 203.

Figure 3A:
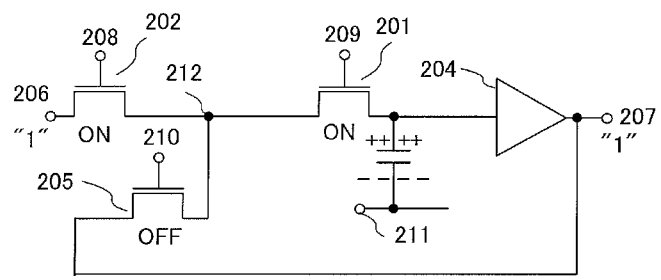
FIGS. 3A and 3B are diagrams illustrating Embodiment 1 of the present invention.

When the charge is accumulated in the capacitor 203, an output of the buffer 204 is "1" and output data of the output terminal 207 is "1" (FIG. 3A).

Figure 3B:
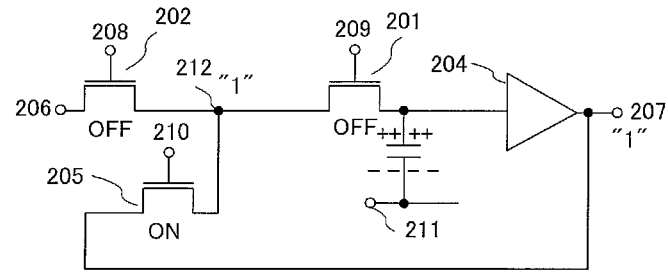

When the output data of the output terminal 207 is "1," the second transistor 202 is turned off by the voltage from the control terminal 208, and the first transistor 201 is turned off by the voltage from the control terminal 209. Further, the third transistor 205 is turned on by a voltage from the control terminal 210 and the output voltage ("1") of the buffer 204 is applied to a node 212 which is between the second transistor 202 and the first transistor 201. Since the output voltage ("1") of the buffer 204 is applied to the node 212, the charge accumulated in the capacitor 203 are held in the capacitor 203 without leakage through the source and the drain of the first transistor 201 (FIG. 3B). Accordingly, refresh operation is not needed.

Note that it is preferable that the capacitor 203 have sufficiently large capacitance. For example, the case where the first transistor 201, the second transistor 202, the third transistor 205, and the buffer 204 are turned off because power supply voltage cannot be maintained by temporary interruption of an electrical wave or the like is considered. In this case, if the capacitor 203 has sufficiently large capacitance, charge accumulated in the capacitor 203 are temporarily held such that the output ("1") of the buffer 204 is not changed. After that, when the power supply voltage is recovered by supplying electric power, the buffer 204 is turned on. Since the charge is accumulated in the capacitor 203, the output of the buffer 204 is "1" and the output data of the output terminal 207 is "1."

(The Case where Output Data is Set to be "0")

The case where charge accumulated in the capacitor 203 are released so that an output of the buffer 204 is set to be "0" and output data of the output terminal 207 is set to be "0" is described.

Figure 4A:
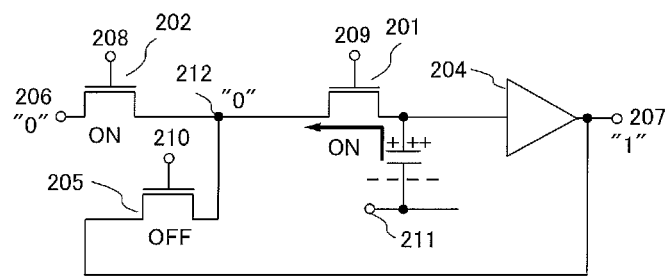
FIGS. 4A and 4B are diagrams illustrating Embodiment 1 of the present invention.

Low voltage "0" is applied to the input terminal 206. The second transistor 202 is turned on by voltage from the control terminal 208. Further, the first transistor 201 is turned on by voltage from the control terminal 209. A potential of the node 212 is lower than a potential of the other of the source and the drain of the first transistor 201 which is electrically connected to the capacitor 203. Charge accumulated in the capacitor 203 is released to the node 212 side of the first transistor 201 through the source and the drain of the first transistor 201 (FIG. 4A).

Figure 4B:
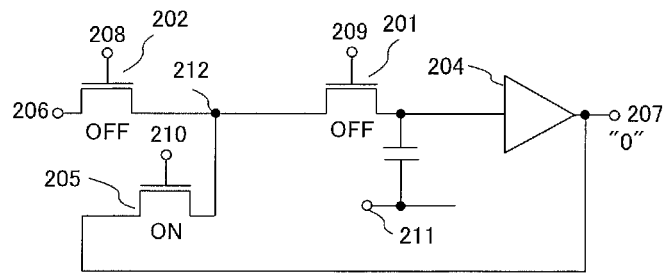

When charge is released, an output of the buffer 204 is "0" and output data of the output terminal 207 is "0" (FIG. 4B).

When the output data of the output terminal 207 is "0," the second transistor 202 is turned off by the voltage from the control terminal 208, and the first transistor 201 is turned off by the voltage from the control terminal 209. In addition, the third transistor 205 is turned on by the voltage from the control terminal 210. Since charge is not accumulated in the capacitor 203 and output voltage ("0") of the buffer 204 is applied to the node 212, a problem of leakage current does not occur. Accordingly, refresh operation is not needed.

Note that if the capacitor 203 has sufficiently large capacitance, even if the buffer 204 is turned off because power supply voltage is not maintained by temporary interruption of an electrical wave or the like, a state in which charge is not accumulated in the capacitor 203 is temporarily held such that the output ("0") of the buffer 204 is not changed. After that, when the power supply voltage is recovered by supplying electric power, the buffer 204 is turned on. Since charge is not accumulated in the capacitor 203, the output of the buffer 204 is "0" and the output data of the output terminal 207 is "0."

An RFID tag can store data with the first transistor 201 and the capacitor 203 without requiring refresh operation.

Embodiment 2

Figure 5A:
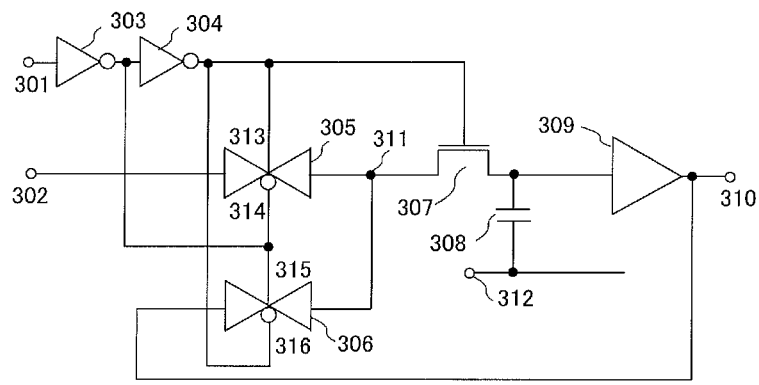
FIGS. 5A and 5B are diagrams each illustrating Embodiment 2 of the present invention.

An RFID tag disclosed in this embodiment includes a circuit including a first inverter 303, a second inverter 304, a first transistor 307, a capacitor 308, a buffer 309, a first analog switch 305, and a second analog switch 306. Reference numerals 301 and 302 each denote an input terminal and reference numeral 310 denotes an output terminal. Reference numeral 312 denotes a reference voltage terminal (FIG. 5A).

The first transistor 307 is an n-channel transistor or a p-channel transistor. In the following description, the first transistor 307 is an n-channel transistor. Note that in the case where the first transistor 307 is a p-channel transistor, voltage whose level is opposite to the level of in the case of an n-channel transistor is applied to the input terminal 301.

Figure 5B:
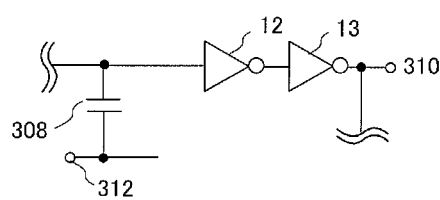

The buffer 309 includes, for example, a circuit in which a third inverter 12 and a fourth inverter 13 are connected in series (FIG. 5B).

The input terminal 301 is electrically connected to an input of the first inverter 303. An output of the first inverter 303 is electrically connected to an input of the second inverter 304, a second control terminal 314 of the first analog switch 305, and a first control terminal 315 of the second analog switch 306. An output of the second inverter 304 is electrically connected to a first control terminal 313 of the first analog switch 305, a second control terminal 316 of the second analog switch 306, and a gate of the first transistor 307.

The input terminal 302 is electrically connected to an input of the first analog switch 305. An output of the first analog switch 305 is electrically connected to one of a source and a drain of the first transistor 307 and an output of the second analog switch 306.

The other of the source and the drain of the first transistor 307 is electrically connected to one electrode of the capacitor 308 and an input of the buffer 309.

The other electrode of the capacitor 308 is electrically connected to the reference voltage terminal 312.

An output of the buffer 309 is electrically connected to the output terminal 310 and an input of the second analog switch 306.

Next, operation an RFID tag is described. In this embodiment, data "1" represents high voltage and data "0" represents low voltage.
(Initial State)

Figure 6:
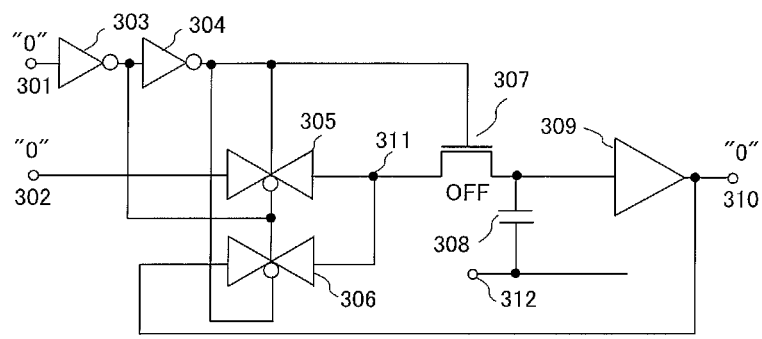
FIG. 6 is a diagram illustrating Embodiment 2 of the present invention.

In an initial state, low voltage "0" is applied to both the input terminal 301 and the input terminal 302, and the first transistor 307 is off. Charge is not accumulated in the capacitor 308. An output of the buffer 309 is "0" and output data of the output terminal 310 is "0" (FIG. 6).

(The Case where Output Data is Set to be "1")

The case where charge is accumulated in the capacitor 308 so that an output of the buffer 309 is set to be "1" and output data of the output terminal 310 is set to be "1" is described.

High voltage "1" is applied to both the input terminal 301 and the input terminal 302. An output of the first inverter 303 is low voltage "0" and an output of the second inverter 304 is high voltage "1." The first analog switch 305 is turned on and high voltage "1" is outputted. In addition, the first transistor 307 is turned on, and charge is accumulated in the capacitor 308 by flowing current which corresponds to an output of the first analog switch 305. The second analog switch 306 is off.

Figure 7A:
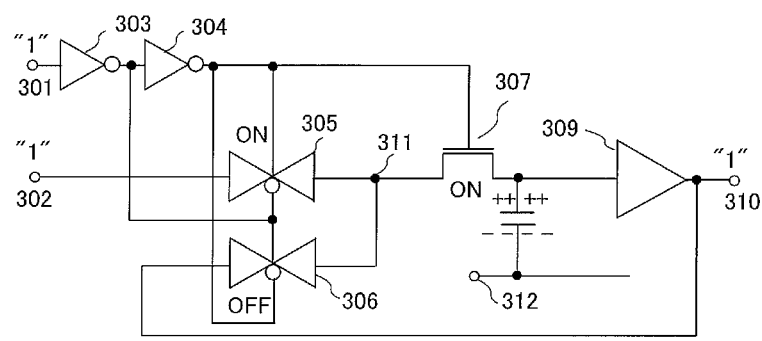
FIGS. 7A and 7B are diagrams illustrating Embodiment 2 of the present invention.

When the charge is accumulated in the capacitor 308, an output of the buffer 309 is "1" and output data of the output terminal 310 is "1" (FIG. 7A).

Figure 7B:
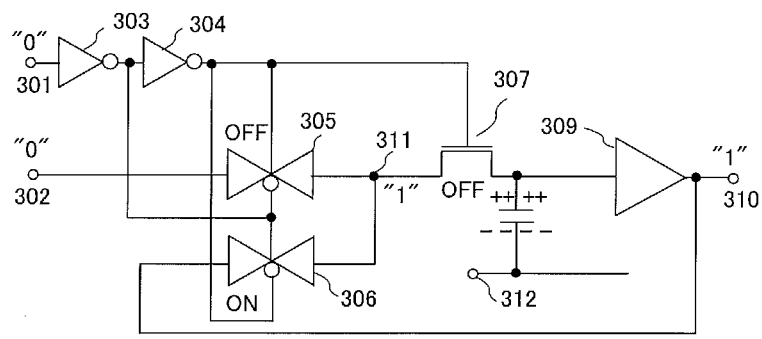

When the output data of the output terminal 310 is "1," low voltage "0" is applied to both the input terminal 301 and the input terminal 302. An output of the first inverter 303 is high voltage "1" and an output of the second inverter 304 is low voltage "0." The first transistor 307 is turned off. The first analog switch 305 is turned off and the second analog switch 306 is turned on. Then, the output voltage ("1") of the buffer 309 is applied to a node 311. Since the output voltage ("1") of the buffer 309 is applied to the node 311, the charge accumulated in the capacitor 308 are held in the capacitor 308 without leakage through the source or the drain of the first transistor 307 (FIG. 7B). Accordingly, refresh operation is not needed.

After that, there is the case where the first inverter 303, the second inverter 304, the first transistor 307, the first analog switch 305, the second analog switch 306, and the buffer 309 are turned off in some cases because power supply voltage cannot be maintained due to temporary interruption of an electrical wave. Therefore, it is preferable that the capacitor 308 have sufficiently large capacitance. If the capacitor 308 has sufficiently large capacitance, charge accumulated in the capacitor 308 is temporarily held such that the output ("1") of the buffer 309 is not changed. After that, when the power supply voltage is recovered by supplying electric power, the buffer 309 is turned on. Since the charge is accumulated in the capacitor 308, an output of the buffer 309 is "1" and output data of the output terminal 310 is "1."

In addition, in the case where low voltage "0" in an initial state is applied to both the input terminal 301 and the input terminal 302 after power supply voltage is recovered by supplying electric power, the first analog switch 305 and the first transistor 307 are turned off, and the second analog switch 306 is turned on. Since the output voltage ("1") of the buffer 309 is applied to the node 311, the charge accumulated in the capacitor 308 is held in the capacitor 308 without leakage through the source or the drain of the first transistor 307. Accordingly, refresh operation is not needed.

(The Case where Output Data is Set to be "0")

The case where charge accumulated in the capacitor 308 is released to set an output of the buffer 309 to be "0" and output data of the output terminal 310 is set to be "0" is described.

Figure 8A:
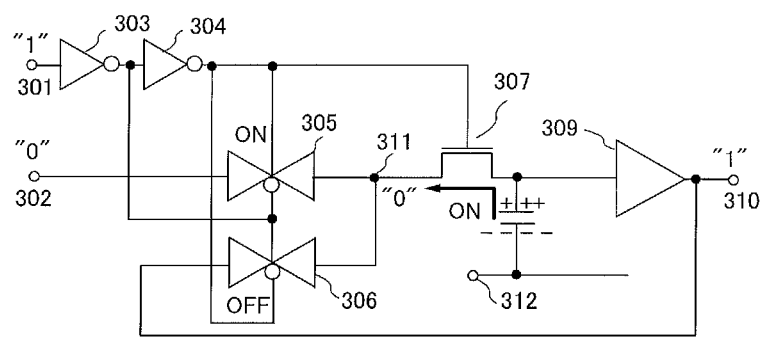
FIGS. 8A and 8B are diagrams illustrating Embodiment 2 of the present invention.

High voltage "1" is applied to the input terminal 301 and low voltage "0" is applied to and the input terminal 302. An output of the first inverter 303 is low voltage "0" and an output of the second inverter 304 is high voltage "1". The first transistor 307 is turned on. The first analog switch 305 is turned on. A potential of the node 311 is lower than a potential of one of the source and the drain of the first transistor 307 which is electrically connected to the capacitor 308. Charge accumulated in the capacitor 308 is released to the node 311 side of the first transistor 307 through the source and the drain of the first transistor 307 (FIG. 8A). The second analog switch 306 is off.

Figure 8B:
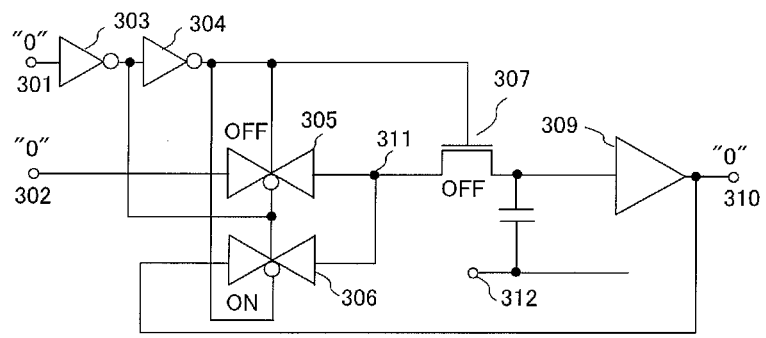

When the charge is released, an output of the buffer 309 is "0" and output data of the output terminal 310 is "0" (FIG. 8B).

When the output data of the output terminal 310 is "0," low voltage "0" is applied to the input terminal 301 and the first transistor 307 is turned off. Since charge is not accumulated in the capacitor 308 and output voltage ("0") of the buffer 309 is applied to the node 311, a problem of leakage current does not occur. Accordingly, refresh operation is not needed.

Note that when the capacitor 308 has sufficiently large capacitance, even if the buffer 309 is turned off because power supply voltage is not maintained due to temporary interruption of an electrical wave, the state in which charge is not accumulated in the capacitor 308 is temporarily held such that the output ("0") of the buffer 309 is not changed. After that, when the power supply voltage is recovered by supplying electric power, the buffer 309 is turned on. Since charge is not accumulated in the capacitor 308, the output of the buffer 309 is "0" and the output data of the output terminal 310 is "0."

In addition, in the case where low voltage "0" in an initial state is applied to both the input terminal 301 and the input terminal 302 after power supply voltage is recovered, the first analog switch 305 and the first transistor 307 are turned off, and the second analog switch 306 is turned on. Since charge is not accumulated in the capacitor 308 and output voltage ("0") of the buffer 309 is applied to the node 311, a problem of leakage current does not occur. Accordingly, refresh operation is not needed.

An RFID tag can store data with the first transistor 307 and the capacitor 308 without requiring refresh operation.

Embodiment 3

Figure 9:
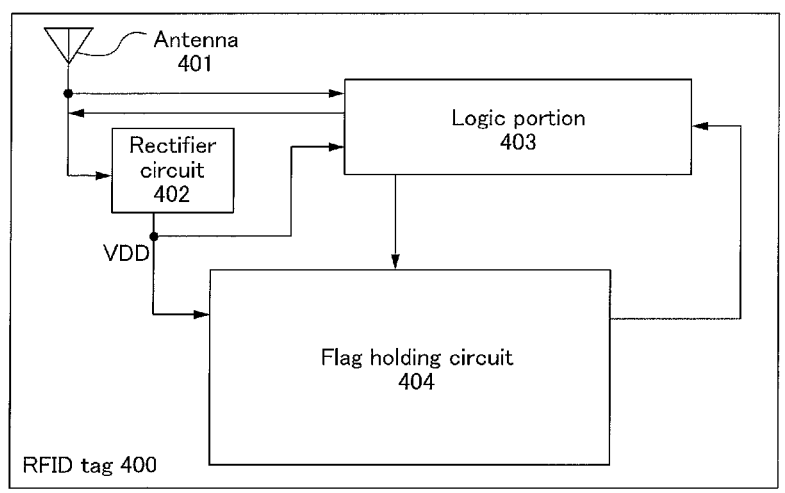
FIG. 9 is a diagram illustrating Embodiment 3 of the present invention.

An RFID tag 400 disclosed in this embodiment includes an antenna 401, a rectifier circuit 402, a logic portion 403, and a flag holding circuit 404 (FIG. 9).

The antenna 401 transmits and receives analog signals in communication with a reader/writer.

The rectifier circuit 402 is connected to the antenna 401. The rectifier circuit 402 rectifies electric power of an electric wave outputted from the reader/writer through the antenna 401, and outputs electric power as power supply voltage VDD.

The power supply voltage VDD obtained by rectification in the rectifier circuit 402 is supplied to the logic portion 403 and the flag holding circuit 404. The logic portion 403 includes a clock circuit, a logic circuit, a modulation circuit, and a demodulation circuit.

The clock circuit generates a clock signal and supplies the clock signal to the logic circuit. The demodulation circuit demodulates an analog signal received by the antenna into a digital signal, and outputs the digital signal to the logic circuit. The modulation circuit modulates a digital signal which is outputted from the logic circuit into an analog signal, and transmits the analog signal to the reader/writer through the antenna.

The logic circuit includes a memory. Further, the logic circuit read out data stored in the memory and write the data to the memory.

The flag holding circuit 404 includes the circuit of the Embodiment 1 or 2.

The circuit shown in Embodiment 1 includes the first transistor 201, the second transistor 202, the capacitor 203, the buffer 204, and the third transistor 205 (FIG. 1).

Each of the control terminal 209 of the first transistor, the control terminal 208 of the second transistor, the control terminal 210 of the third transistor, and the input terminal 206 is controlled by an output from the logic circuit in the logic portion 403. The output terminal 207 is connected to the logic circuit of the logic portion 403.

Power supply voltage VDD is supplied to the flag holding circuit 404 from the rectifier circuit 402. Alternatively, the power supply voltage VDD is supplied to the flag holding circuit 404 from the rectifier circuit 402 through the logic portion 403. Specifically, power supply voltage VDD to the buffer 204 is supplied from the rectifier circuit 402. Alternatively, the power supply voltage VDD to the buffer 204 is supplied from the rectifier circuit 402 through the logic portion 403.

The flag holding circuit 404 having the circuit shown in Embodiment 1 can store data (charge) with the first transistor 201 and the capacitor 203. Accordingly, refresh operation is not needed. Further, if the capacitor 203 has sufficiently large capacitance, charge accumulated in the capacitor 203 is temporarily held such that an output of the buffer 204 is not changed even when supply of power supply voltage VDD from the rectifier circuit 402 stops. Accordingly, a state of a session flag for preventing data which has already been read from being read out again can be held.

In addition, the circuit shown in Embodiment 2 includes the first inverter 303, the second inverter 304, the first transistor 307, the capacitor 308, the buffer 309, the first analog switch 305, and the second analog switch 306 (FIG. 5).

Each of the input terminal 301 and the input terminal 302 is controlled by an output from the logic circuit of the logic portion 403. The output terminal 310 is connected to the logic circuit in the logic portion 403.

As above, power supply voltage VDD is supplied to the flag holding circuit 404 from the rectifier circuit 402. Alternatively, the power supply voltage VDD is supplied to the flag holding circuit 404 from the rectifier circuit 402 through the logic portion 403. Specifically, power supply voltage VDD to the first inverter 303, power supply voltage VDD to the second inverter 304, power supply voltage VDD to the buffer 309, power supply voltage VDD to the first analog switch 305, and power supply voltage VDD to the second analog switch 306 are supplied from the rectifier circuit 402. Alternatively, the power supply voltage VDD to the first inverter 303, the power supply voltage VDD to the second inverter 304, the power supply voltage VDD to the buffer 309, the power supply voltage VDD to the first analog switch 305, and the power supply voltage VDD to the second analog switch 306 are supplied from the rectifier circuit 402 through the logic portion 403.

The flag holding circuit 404 having a semiconductor device shown in Embodiment 2 can store data (charge) with the first transistor 307 and the capacitor 308. Accordingly, refresh operation is not needed. Further, if the capacitor 308 has sufficiently large capacitance, charge accumulated in the capacitor 308 are temporarily held such that an output of the buffer 309 is not changed even when supply of the power supply voltage VDD from the rectifier circuit 402 stops. Accordingly, the state of a session flag for preventing data which has already been read from being read out again can be held.

Embodiment 4

In this embodiment, an REID tag having a structure which is different from that in Embodiment 3 is described.

Figure 10:
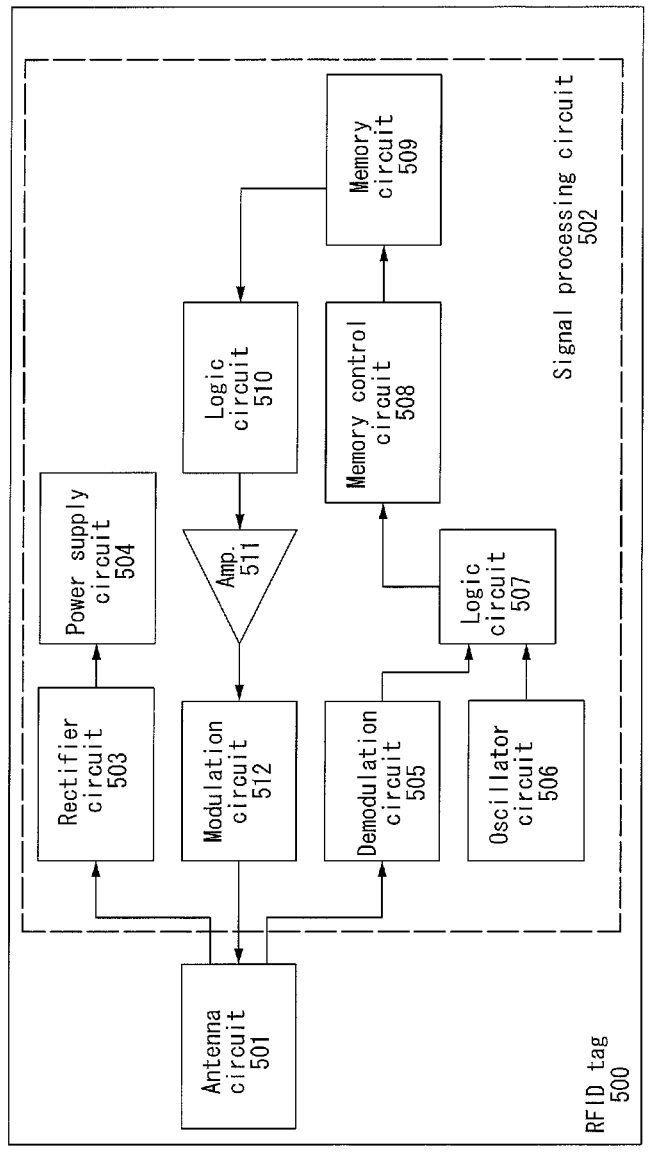
FIG. 10 is a diagram illustrating Embodiment 4 of the present invention.

An RFID tag 500 shown in this embodiment includes an antenna circuit 501 and a signal processing circuit 502. The signal processing circuit 502 includes a rectifier circuit 503, a power supply circuit 504, a demodulation circuit 505, an oscillator circuit 506, a logic circuit 507, a memory control circuit 508, a memory circuit 509, a logic circuit 510, an amplifier 511, and a modulation circuit 512 (FIG. 10). The memory circuit 509 includes the circuit of the Embodiment 1 or 2.

Communication signals received by the antenna circuit 501 are inputted into the demodulation circuit 505. The frequency of the communication signals received, that is, signals transmitted and received between the antenna circuit 501 and a reader/writer can be, UHF (ultra high frequency) bands including 915 MHz, 2.45 GHz, and the like that are determined on the basis of the ISO standards or the like. Needless to say, the frequency of signals transmitted and received between the antenna circuit 501 and the reader/writer is not limited to this, and for example, any of the following frequencies can be used: 300 GHz to 3 THz which is a submillimeter wave, 30 GHz to 300 GHz which is a millimeter wave, 3 GHz to 30 GHz which is a microwave, 300 MHz to 3 GHz which is an ultra high frequency, and 30 MHz to 300 MHz which is a very high frequency. In addition, signals transmitted and received between the antenna circuit 501 and the reader/writer are signals obtained through carrier modulation. A carrier wave is modulated by analog modulation or digital modulation, and any of amplitude modulation, phase modulation, frequency modulation, and spread spectrum may be used. Preferably, amplitude modulation or frequency modulation is used.

An oscillation signal outputted from the oscillator circuit 506 is supplied as a clock signal to the logic circuit 507. In addition, the carrier wave that has been modulated is demodulated in the demodulation circuit 505. The demodulated signal is transmitted to the logic circuit 507 and analyzed. The signal analyzed in the logic circuit 507 is transmitted to the memory control circuit 508. The memory control circuit 508 controls the memory circuit 509 and takes data stored in the memory circuit 509 to transmit the data to the logic circuit 510. The signal transmitted to the logic circuit 510 is encoded in the logic circuit 510 and then amplified in the amplifier 511. With the amplified signal, the modulation circuit 512 modulates a carrier wave. With the modulated carrier, the reader/writer recognizes the signal from the RFID tag.

Carrier waves inputted to the rectifier circuit 503 are rectified and then inputted to the power supply circuit 504. Power supply voltage obtained in this manner is supplied from the power supply circuit 504 to the demodulation circuit 505, the oscillator circuit 506, the logic circuit 507, the memory control circuit 508, the memory circuit 509, the logic circuit 510, the amplifier 511, the modulation circuit 512, and the like.

A connection between the signal processing circuit 502 and an antenna in the antenna circuit 501 is not specifically limited. For example, the antenna and the signal processing circuit 502 are connected by wire bonding or bump connection. Alternatively, the signal processing circuit 502 is formed to have a chip shape and one surface thereof is used as an electrode to be attached to the antenna. The signal processing circuit 502 and the antenna can be attached to each other by the use of an ACF (anisotropic conductive film).

The antenna is either stacked over the same substrate as the signal processing circuit 502, or formed as an external antenna. Needless to say, the antenna is provided on the above or below of the signal processing circuit.

The rectifier circuit 503 converts AC signals that are induced by carrier waves received by the antenna circuit 501 into DC signals.

Figure 11:
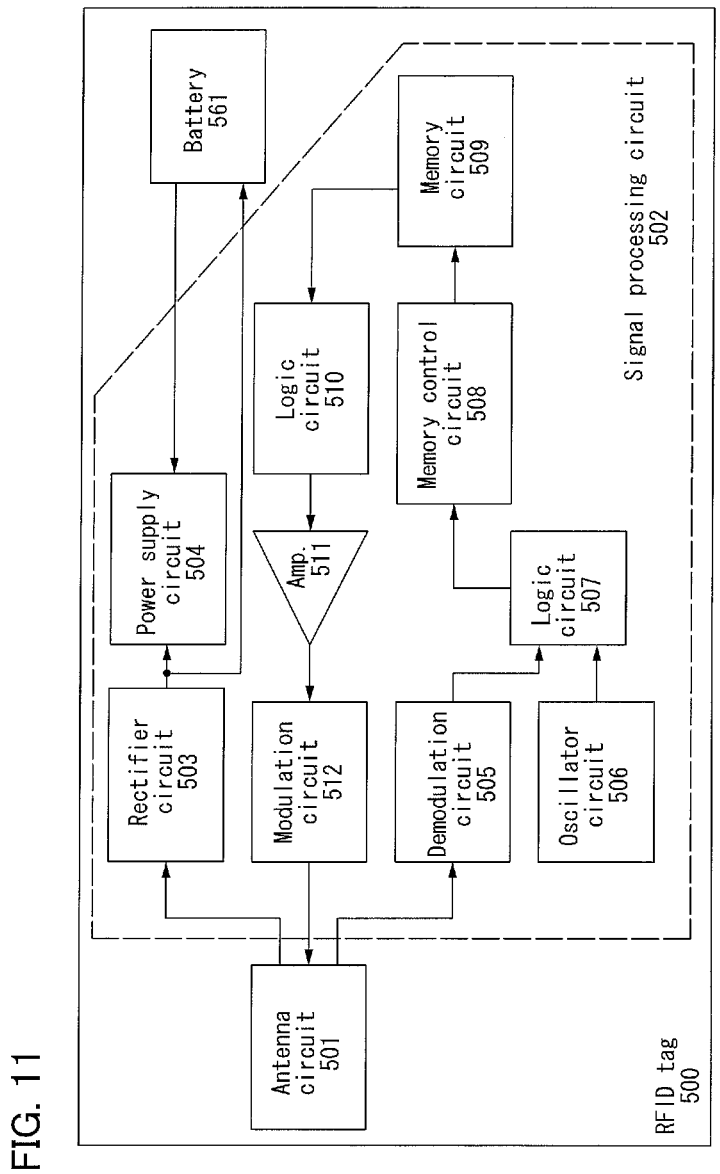
FIG. 11 is a diagram illustrating Embodiment 4 of the present invention.

The RFID tag 500 may include a battery 561 (FIG. 11). When power supply voltage outputted from the rectifier circuit 503 is not high enough to operate the signal processing circuit 502, the battery 561 also supplies power supply voltage to each circuit of the signal processing circuit 502, such as the demodulation circuit 505, the oscillator circuit 506, the logic circuit 507, the memory control circuit 508, the memory circuit 509, the logic circuit 510, the amplifier 511, and the modulation circuit 512.

Surplus voltage of the power supply voltage outputted from the rectifier circuit 503 may be stored in the battery 561. An antenna circuit and a rectifier circuit are provided in the RFID tag 500 in addition to the antenna circuit 501 and the rectifier circuit 503, so that energy stored in the battery 561 can be obtained from electromagnetic waves and the like that are generated randomly.

A battery can be continuously used by charging. As the battery, a battery formed into a sheet form is used. For example, by using a lithium polymer battery that includes a gel electrolyte, a lithium ion battery, a lithium secondary battery, or the like, reduction in size of the battery is possible. Example of a nickel metal hydride battery, a nickel cadmium battery, or the like can be given. Alternatively, a capacitor having large capacitance or the like can be used.

Embodiment 5

In this embodiment, one manufacturing method of the RFID tag shown in the above embodiment is described.

Figure 12A:
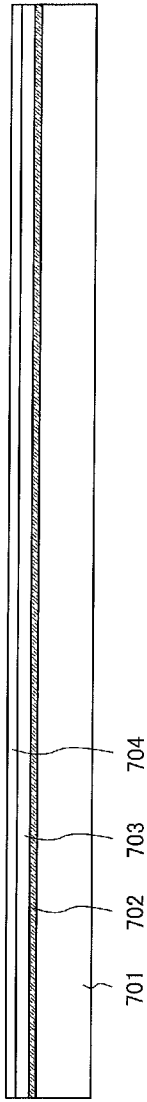
FIGS. 12A, 12B, and 12C are diagrams illustrating Embodiment 5 of the present invention.

A separation layer 702 is formed over a surface of a substrate 701, and an insulating film 703 serving as a base and a semiconductor film 704 (e.g., a film containing amorphous silicon) are formed over the separation layer 702 (FIG. 12A). The separation layer 702, the insulating film 703, and the semiconductor film 704 can be formed successively. As a result, entering of impurities can be prevented because the films are not exposed to the atmosphere.

As the substrate 701, a glass substrate, a quartz substrate, a metal substrate, a stainless steel substrate, a plastic substrate which can resist the processing temperature of this process, or the like is used.

As the separation layer 702, a metal film or a stacked layer of a metal film and a metal oxide film is used.

The metal film is formed using a single layer or a stacked layer structure formed from an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir); or an alloy material or a compound material which includes any of these elements as a main component. The metal film is formed by a sputtering method, a plasma CVD method, or the like.

After the above-described metal film is formed, an oxide or oxynitride of the metal film is formed as the stacked layer of a metal film and a metal oxide film over a surface of the metal film by plasma treatment in an oxygen atmosphere or an $N_2O$ atmosphere, or heat treatment in an oxygen atmosphere or an $N_2O$ atmosphere. Alternatively, a surface of the metal film is processed with a strong oxidative solution such as ozone water after the metal film is formed, whereby an oxide of the metal film is formed over the surface of the metal film.

The insulating film 703 is a single-layer structure film or a stacked-layer structure film containing an oxide of silicon or a nitride of silicon, and is formed by using a sputtering method, a plasma CVD method, or the like. The insulating film 703 prevents impurities from entering from the substrate 701.

The semiconductor film 704 is formed by a sputtering method, an LPCVD method, a plasma CVD method, or the like. The semiconductor film 704 is formed to have a thickness of approximately 25 to 200 nm, preferably approximately 50 to 70 nm. The semiconductor film 704 is, for example, an amorphous silicon film or an oxide semiconductor film including ZnO.

The semiconductor film 704 may be crystallized by laser irradiation or the like, and a crystalline semiconductor film may be formed.

Figure 12B:
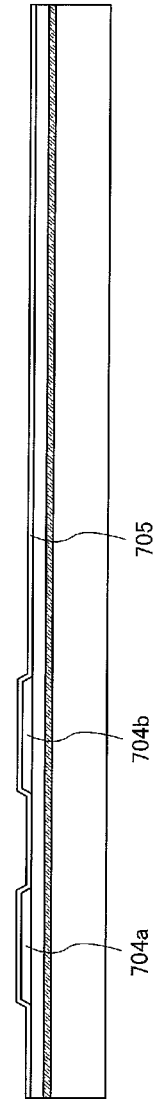

The semiconductor film 704 is etched to have a desired shape, whereby a semiconductor film 704a and a semiconductor film 704b are formed. A gate insulating film 705 is formed so as to cover the semiconductor films 704a and 704b (FIG. 12B).

The gate insulating film 705 is a single-layer film or a stacked-layer film containing an oxide of silicon or a nitride of silicon formed by a CVD method, a sputtering method, or the like.

The gate insulating film 705 may be formed by oxidizing or nitriding surfaces of the semiconductor films 704a and 704b by plasma treatment. For example, the gate insulating film is formed by plasma treatment with a mixed gas of a rare gas such as He, Ar, Kr, or Xe; and oxygen, nitrogen oxide (e.g. $NO_2$), ammonia, nitrogen, hydrogen, or the like. When excitation of the plasma in this case is performed by using microwaves, plasma with a low electron temperature and high density can be generated. The surfaces of the semiconductor films can be oxidized or nitrided by oxygen radical (that include OH radical in some cases) or nitrogen radical (that include NH radical in some cases), which is generated by the high-density plasma.

By treatment with such high-density plasma, an insulating film having a thickness of approximately 1 to 20 nm typically approximately 5 to 10 nm is formed over the semiconductor films. Since reaction in this case is solid-phase reaction, interface state density between the insulating film and the semiconductor films can be made quite low. The semiconductor films (crystalline silicon, polycrystalline silicon, an oxide semiconductor film including ZnO, or the like) are directly oxidized (or nitrided) by such plasma treatment, whereby variation in thickness of the formed insulating film can be considerably reduced. In addition, since oxidation does not progress even at a crystal grain boundary of crystalline silicon, it is very preferable.

As the gate insulating film 705, only an insulating film formed by the plasma treatment is used or an insulating film formed from silicon oxide, silicon oxynitride, or silicon nitride is additionally deposited over the insulating film by a CVD method using plasma or thermal reaction. A transistor including a gate insulating film formed by plasma treatment has little variation in characteristics.

A conductive film is formed over the gate insulating film 705. A single conductive film with a thickness of approximately 100 to 500 nm is formed. The following materials are used: a material containing an element selected from tantalum (Ta), tungsten (W), titanium (Ti), molybdenum (Mo), aluminum (Al), copper (Cu), chromium (Cr), or niobium (Nb); an alloy material containing the element as a main component; or a compound material containing the element as a main component. A semiconductor material typified by polycrystalline silicon in which an impurity element such as phosphorus is added may be used. For example, a stacked-layer structure of a tantalum nitride film and a tungsten film, a stacked-layer structure of a tungsten nitride film and a tungsten film, or a stacked-layer structure of a molybdenum nitride film and a molybdenum film is used.

A resist mask is formed over the conductive film by a photolithography method and etching treatment is performed, whereby a gate electrode 707 is formed above the semiconductor films 704a and 704b.

Using the gate electrode 707 as a mask, an impurity element imparting n-type or p-type conductivity is added to the semiconductor films 704a and 704b at a low concentration by an ion doping method or an ion implantation method with the mask. In this embodiment, an impurity element imparting n-type conductivity is added to the semiconductor films 704a and 704b at a low concentration. The impurity element imparting n-type conductivity is an element belonging to Group 15, for example, phosphorus (P) or arsenic (As). The impurity element imparting p-type conductivity is an element belonging to Group 13, for example, boron (B).

Although n-channel TFTs are described in this embodiment, this embodiment is not limited to n-channel TFTs. Only p-channel TFTs may be formed. Alternatively, n-channel TFTs and p-channel TFTs may be formed.

An insulating film is formed so as to cover the gate insulating film 705 and the gate electrode 707. The insulating film is a film including an inorganic material such as silicon, an oxide of silicon, or a nitride of silicon formed by a CVD method, a sputtering method, or the like.

The insulating film is selectively etched by anisotropic etching, whereby insulating films 708 (also referred to as sidewalls) in contact with side surfaces of the gate electrode 707 are formed. The insulating films 708 are used as masks when lightly doped drain (LDD) regions are formed.

Figure 12C:
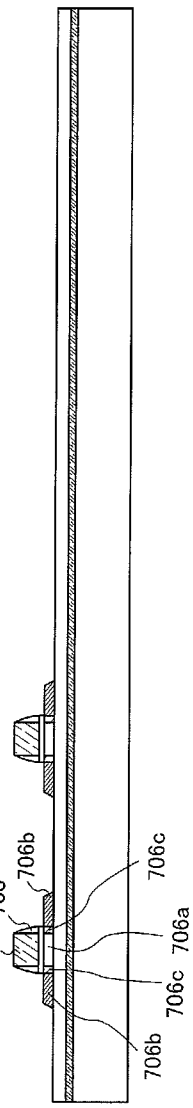

By using the resist mask formed by a photolithography method, the gate electrode 707, and the insulating films 708 as masks, an impurity element imparting n-type conductivity is added to the semiconductor films 704a and 704b. Thus, a channel formation region 706a, first impurity regions 706b, and second impurity regions 706c are formed (FIG. 12C). The first impurity regions 706b are a source region and drain region of the thin film transistor, and the second impurity regions 706c are LDD regions. The concentration of the impurity element included in the second impurity region 706c is lower than that of the impurity element included in the first impurity region 706b.

Then, an insulating film is formed so as to cover the gate electrode 707, the insulating films 708, and the like. In this embodiment, the insulating film has a three-layer structure of insulating films 709, 710, and 711. The insulating film is formed by a CVD method or the like. The insulating films 709 and 710 are films each including an inorganic material such as silicon, an oxide of silicon, or a nitride of silicon, and the insulating film 711 is a film including an organic material such as an organic resin.

The insulating films 709, 710, and 711 are etched to form contact holes reaching the first impurity regions 706b. Then, conductive films 731a functioning as source electrodes and drain electrodes of the thin film transistors and a conductive film 731b functioning as a connecting wiring are formed. The conductive films 731a and 731b are formed in such a manner: a conductive film is formed so as to fill the contact holes and then the conductive film is selectively etched. Note that before the conductive film is formed, silicide may be formed over the surfaces of the semiconductor films 704a and 704b that are exposed through the contact holes to reduce resistance. When the conductive films 731a and 731b are formed using low-resistance material, delay of signals does not occur, which is preferable. Since a low-resistance material has low heat resistance in many cases, high heat resistance materials are preferably provided over and below the low-resistance material. The conductive films 731a and 731b are formed by a CVD method, a sputtering method, or the like.

Through these steps, an element layer 749 including a thin film transistor 730a and a thin film transistor 730b can be obtained (FIG. 13A). The thin film transistors 730a and 730b are used as transistors shown in Embodiments 1 and 2.

Heat treatment for repairing crystallinity of the semiconductor film 704, activating the impurity element which is added to the semiconductor film 704, and hydrogenating the semiconductor film 704 may be performed before the insulating films 709, 710, and 711 are formed, after the insulating film 709 is formed, or after the insulating films 709 and 710 are formed. For the heat treatment, a thermal annealing method, a laser annealing method, an RTA method, or the like is applied.

Insulating films 712 and 713 are formed so as to cover the conductive films 731a and 731b (FIG. 13B). A silicon nitride film with a thickness of 50 to 150 nm, 100 nm for example, is used as the insulating film 712, and a polyimide film having a thickness of 1000 to 2000 nm, for example, 1500 nm is used as the insulating film 713. It is preferable that a surface of the insulating film 713 have high flatness. A silicon oxynitride film or a silicon nitride oxide film may be used instead of the silicon nitride film. An organic material such as polyamide, benzocyclobutene, acrylic, or epoxy; a siloxane material; or the like may be used instead of polyimide. The insulating films 712 and 713 are formed by a CVD method, a sputtering method, an SOG method, a droplet discharge method, a screen printing method, or the like.

An opening is formed in the insulating films 712 and 713. Specifically, an opening 714 where the connection wiring 731b is exposed is formed. In the opening 714 (specifically, in a region 715 surrounded by a dotted line), an end portion of the insulating film 712 is covered with the insulating film 713. By covering the end portion of the lower insulating film 712 with the upper insulating film 713, disconnection of a wiring to be formed later in the opening 714 can be prevented. In this embodiment, since the insulating film 713 is formed using polyimide, which is an organic material, the insulating film 713 can have a gently tapered shape in the opening 714, and disconnection can be efficiently prevented.

A conductive film 717 is formed over the insulating film 713, and an insulating film 718 is formed over the conductive film 717 (FIG. 13C).

The conductive film 717 can be formed using the same material as the conductive films 731a and 731b. Since current based on signals between a thin film transistor and an antenna flows through the conductive film 717, the conductive film 717 is formed from a conductive material such as aluminum. The conductive film 717 is formed by a CVD method, a sputtering method, or the like. The insulating film 718 needs to have a planar surface; therefore, the insulating film 718 is preferably formed from an organic material. Here, the case where polyimide having a thickness of 1000 to 3000 nm, for example, 2000 nm, is used for the insulating film 718 is described as an example.

The insulating film 718 is formed, for example, to a thickness of 2000 nm, which is larger than the thickness of the insulating film 713, because irregularities on the surfaces of the opening 714 in the insulating film 713 and the conductive film 717 formed in the opening 714 should be planarized.

Figure 14:
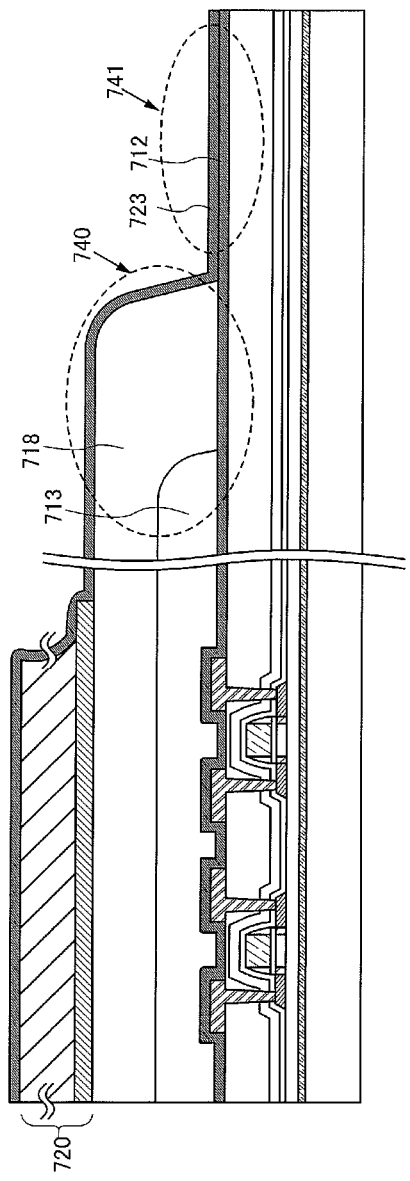
FIG. 14 is a diagram illustrating Embodiment 5 of the present invention.

FIG. 14 shows the peripheral region of a semiconductor device. In a circuit portion, the insulating film 718 preferably covers an end portion of the insulating film 713 outside the antenna (specifically, in a region 740). Intrusion of moisture or oxygen can be prevented.

An antenna 720 is formed over the insulating film 718 (FIG. 15A). The antenna 720 and the conductive film 717 are connected to each other through an opening (not shown).

The antenna 720 is formed using a stacked layer of a first conductive film 721 and a second conductive film 722. In this embodiment, the case where the antenna 720 is formed using a stacked layer of titanium having a thickness of 50 to 150 nm, for example, 100 nm as the first conductive film 721, and aluminum having a thickness of 4000 to 6000 nm, for example, 5000 nm as the second conductive film 722 is described as an example. Titanium can increase moisture resistance of the antenna and can increase adhesion between the insulating film 718 and the antenna 720. In addition, contact resistance between the first conductive film 721 and the conductive film 717 can be reduced. In this embodiment, an end portion of aluminum is on an inner side of an end portion of titanium (a region 742). The end portion of the aluminum film may be formed inside of the titanium film, and the distance L between the end portion of aluminum and that of titanium may be in the range of 0.8 to 2 μm (FIG. 15A). The thickness of aluminum is set to be larger than the thickness of titanium and the end portion of titanium projects beyond the end portion of aluminum, whereby disconnection of an insulating film formed later can be prevented, and the durability of the antenna can be improved.

The antenna is formed by a CVD method, a sputtering method, a printing method such as a screen printing method or a gravure printing method, a droplet discharge method, a dispenser method, a plating method, or the like. Further, the antenna is a stacked-layer film or a single-layer film.

An insulating film 723 is formed so as to cover the antenna 720. In this embodiment, a silicon nitride film having a thickness of 200 nm is used as the insulating film 723. The insulating film 723 enhances the moisture resistance of the antenna. Since the end portion of titanium projects beyond the end portion of aluminum, the insulating film 723 can be formed without disconnection. The insulating film 723 may be formed of a silicon oxynitride film, a silicon nitride oxide film, or another inorganic material.

The insulating film 723 and the insulating film 712 are preferably in contact with each other outside the insulating film 718, that is, outside the antenna in the circuit portion (specifically, a region 741) (FIG. 14). If both of the insulating films 712 and 723 are silicon nitride films, since the films formed from the same materials are closely in contact with each other, adhesion is high and intrusion of moisture or oxygen can be efficiently prevented. Further, since a silicon nitride film is denser than a silicon oxide film and thus intrusion of moisture or oxygen can be effectively prevented. The region where the insulating films 712 and 723 are closely in contact with each other is the peripheral region and are formed so as to surround the circuit portion. Compared to an RFID tag to which such a structure of a peripheral region is not applied, the RFID tag of this embodiment can have reduced defects caused by a change over time in shape and characteristics, such as peeling at an end portion of the RFID tag.

A first insulator 751 is formed so as to cover the insulating film 723 (FIG. 15B). The first insulator 751 is a structure body 726 in which a fibrous body 727 is impregnated with an organic resin 728. In addition, a first impact attenuating layer 750 is formed over a surface of the structure body 726. The first impact attenuating layer 750 is an aramid resin layer.

The structure body 726 in which the fibrous body 727 is impregnated with the organic resin 728 is also referred to as a prepreg. The prepreg is specifically obtained in such a manner that a fibrous body is impregnated with a varnish in which a matrix resin is diluted with an organic solvent, and then the organic solvent is volatilized so that the matrix resin is semi-cured. A prepreg has an elastic modulus of 13 to 15 GPa and a modulus of rupture of 140 MPa. With a thinned prepreg, a thin flexible RFID tag can be manufactured. As typical examples of a fibrous body for a prepreg, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As typical examples of an organic resin are an epoxy resin, an unsaturated polyester resin, a polyimide resin, a fluoropolymer, and the like can be given.

The thickness of the first insulator 751 is 5 to 100 μm preferably 10 to 50 μm, inclusive. In this embodiment, the thickness of the first insulator 751 is 32 μm. In this embodiment, in the first insulator 751, the thickness of the structure body 726 is 10 to 30 μm, for example, 20 μm, and the thickness of the first impact attenuating layer 750 is 5 to 15 μm, for example, 12 μm. With these parameters, a thin flexible RFID tag can be manufactured.

After the first impact attenuating layer 750 is formed, a first conductive layer 729 is formed over a surface of the first impact attenuating layer 750. A compound of silicon oxide and indium tin oxide is used as the first conductive layer 729. The first conductive layer 729 has lower resistance than the structure body 726 or the first impact attenuating layer 750. The first conductive layer 729 may be formed using a film or a group of islands arranged with small gaps therebetween. The thickness of the first conductive layer 729 can be 50 to 200 nm, inclusive. As well as the compound of silicon oxide and indium tin oxide, the first conductive layer 729 can be formed using a material including an element selected from titanium, molybdenum, tungsten, aluminum, copper, silver, gold, nickel, tin, platinum, palladium, iridium, rhodium, tantalum, cadmium, zinc, iron, silicon, germanium, zirconium, barium, or the like; an alloy material including any of these elements as a main component; a compound material including any of these elements as a main component; or the like. The first conductive layer 729 is formed by a sputtering method, a plasma CVD method, a coating method, a printing method, or a plating method such as an electrolytic plating method or an electroless plating method. Note that an insulating film may be formed over a surface of the first conductive layer 729. The insulating film may protect the first conductive layer 729.

Figure 16:
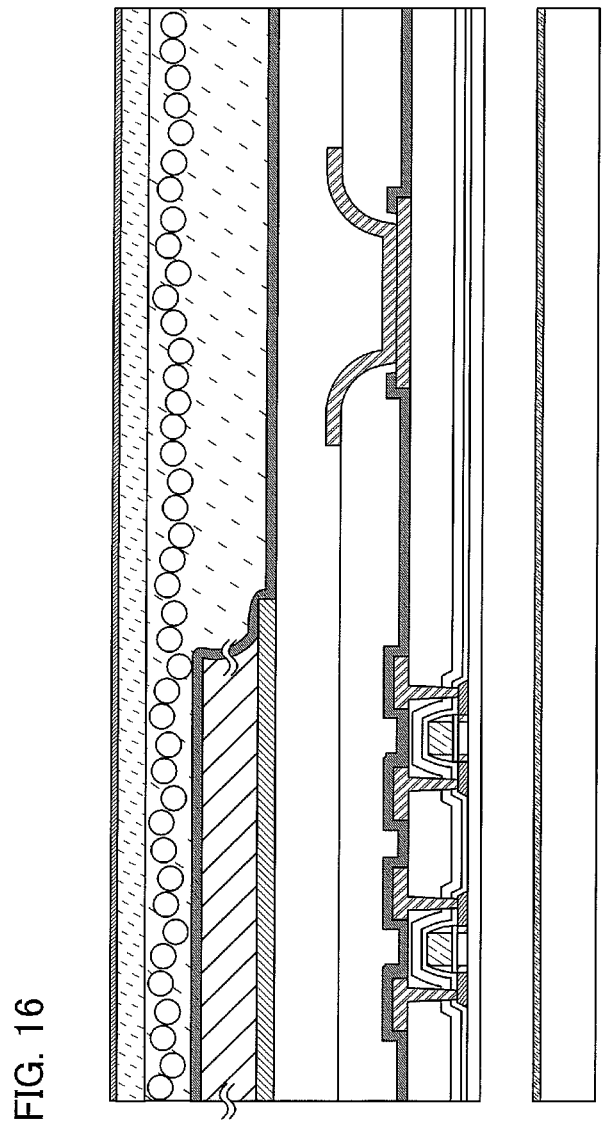
FIG. 16 is a diagram illustrating Embodiment 5 of the present invention.

A layer including the element layer including the thin film transistors 730a and 730b, the conductive film serving as the antenna 720, and the like is separated from the substrate 701 (FIG. 16). Separation is performed at an interface between the separation layer 702 and the substrate 701, an interface between the separation layer 702 and the insulating film 703, or the inside of the separation layer 702. If the separation layer 702 remains on the separated layer side, the separation layer 702 may be removed by etching or the like.

The separation is performed while wetting a separation surface with water or a solution such as ozone water, so that elements such as the thin film transistors 730a and 730b can be prevented from being broken due to static electricity or the like. This is because an unpaired electron in the separation layer 702 is terminated by ions in the solution, so that charge is neutralized.

Lower cost can be realized by reusing the substrate 701 subjected to the separation.

Figure 17:
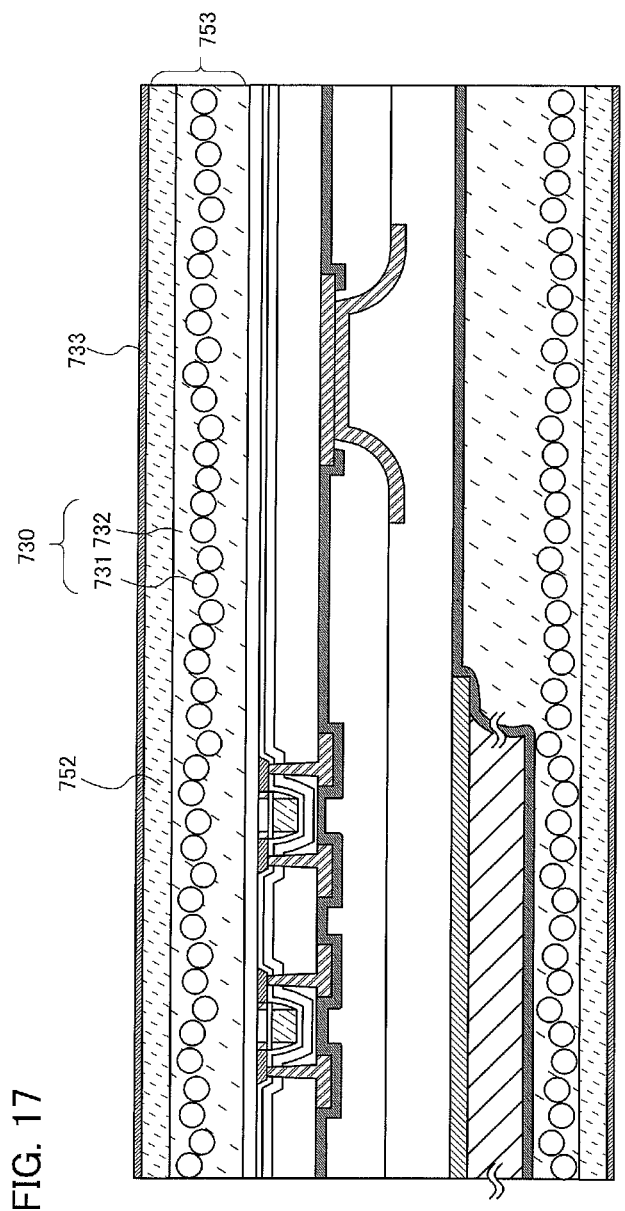
FIG. 17 is a diagram illustrating Embodiment 5 of the present invention.

A second insulator 753 is formed so as to cover the surface exposed by the separation (FIG. 17). The second insulator 753 can be formed in a manner similar to that of the first insulator 751. In this embodiment, as the second insulator 753, a structure body 730 including a so-called prepreg, in which a fibrous body 731 is impregnated with an organic resin 732, is provided. Further, a second impact attenuating layer 752 is provided on a surface of the structure body 730. An aramid resin is used for the second impact attenuating layer 752. Needless to say, it is possible to provide the structure bodies 726 and 730 only. In that case, the thickness of the RFID tag will be 40 to 70 nm, preferably 40 to 50 μm. The thickness of the RFID tag in the case where the first and second impact attenuating layers are provided is 70 to 90 nm preferably 70 to 80 nm.

A second conductive layer 733 is formed over a surface of the second insulator 753. The second conductive layer 733 can be formed in a manner similar to the first conductive layer 729. Further, an insulating film may be formed over a surface of the second conductive layer 733. The insulating layer protects the second conductive layer 733. Through the above steps, the element layer and the antenna are sealed between the first insulator 751 and the second insulator 753, so that a layered body can be obtained in which the first conductive layer 729 is formed over a surface of the first insulator 751, and the second conductive layer 733 is formed over the surface of the second insulator 753.

Then, the layered body is cut with a cutting means into separate RFID tags. As the cutting means, it is preferable to use a means which melts the first insulator 751 and the second insulator 753 in the cutting. It is more preferable to use a means which melts the first conductive layer 729 and the second conductive layer 733. In this embodiment, laser irradiation is used for cutting the semiconductor device.

By cutting the semiconductor device into separate RFID tags by laser irradiation, the resistance value between the first conductive layer 729 and the second conductive layer 733 is decreased, whereby the first conductive layer 729 and the second conductive layer 733 are brought into conduction. Accordingly, the step of cutting the semiconductor device into the RFID tags and the step of bringing the first conductive layer 729 and the second conductive layer 733 into conduction can be performed in a single operation.

In such a manner, the RFID tag formed using an insulating substrate can be completed.

This embodiment can be implemented in combination with any of the other embodiments as appropriate.

The present invention is not limited to the above description, and it is easily understood by those skilled in the art that modes and details can be modified in various ways without departing from the spirit and scope of the present invention. Therefore, the invention is not interpreted limited to the above description.

This application is based on Japanese Patent Application serial no. 2009-012050 filed with Japanese Patent Office on Jan. 22, 2009, the entire contents of which are hereby incorporated by reference.

What is claimed is:

1. A semiconductor device comprising:
   a first transistor;
   a second transistor;
   a third transistor;
   a capacitor; and
   a buffer,
   wherein one of a source and a drain of the second transistor is electrically connected to an input terminal,
   wherein the other of the source and the drain of the second transistor is electrically connected to one of a source and a drain of the first transistor and one of a source and a drain of the third transistor at a first node,
   wherein the other of the source and the drain of the first transistor is electrically connected to one electrode of the capacitor and an input of the buffer at a second node, wherein the other electrode of the capacitor is electrically connected to a reference voltage terminal, wherein an output of the buffer is electrically connected to an output terminal and the other of the source and the drain of the third transistor, and wherein the first node has a lower capacitance than the capacitor.

2. A semiconductor device according to claim 1, wherein the semiconductor device is configured to prevent current leakage through the source and the drain of the first transistor by putting the first transistor and the second transistor in an off state and insuring connection between the output of the buffer and the one of the source and the drain of the first transistor when the first transistor and the second transistor are in the off state.

3. A semiconductor device according to claim 1, wherein the semiconductor device is configured to prevent current leakage of charges accumulated in the capacitor through the source and the drain of the first transistor when the first transistor is in the off state.

4. A semiconductor device comprising:
an antenna;
a rectifier circuit;
a logic portion; and
a flag holding circuit,
wherein the logic portion includes a clock circuit, a logic circuit, a demodulation circuit, and a modulation circuit,
wherein the flag holding circuit includes a first transistor, a second transistor, a third transistor, a capacitor, and a buffer,
wherein the antenna is connected to the rectifier circuit,
wherein the rectifier circuit is connected to the logic portion and the flag holding circuit,
wherein a gate of the second transistor is electrically connected to the logic circuit, one of a source and a drain of the second transistor is electrically connected to an input terminal, and the other of the source and the drain of the second transistor is electrically connected to one of a source and a drain of the first transistor and one of a source and a drain of the third transistor,
wherein a gate of the first transistor is electrically connected to the logic circuit, and the other of the source and the drain of the first transistor is electrically connected to one electrode of the capacitor and an input of the buffer,
wherein the other electrode of the capacitor is electrically connected to a reference voltage terminal,
wherein an output of the buffer is electrically connected to an output terminal and the other of the source and the drain of the third transistor, and
wherein a gate of the third transistor is electrically connected to the logic circuit.

5. A semiconductor device according to claim 4, wherein the rectifier circuit supplies power supply voltage to the logic portion and the flag holding circuit.

6. A semiconductor device according to claim 4, configured so that,
when the second transistor and the first transistor are turned on, a charge based on a signal received by the antenna is accumulated in the capacitor, and data corresponding to the charge is outputted from the buffer to the output terminal, and
when, after the charge is accumulated, the second transistor and the first transistor are turned off and the third transistor is turned on, and an output from the buffer is applied to one of the source and the drain of the first transistor, the charge is held in the capacitor.

7. A semiconductor device according to claim 6, configured so that,
when the second transistor and the first transistor are turned on, the charge accumulated in the capacitor is released to one of the source and the drain of the first transistor, and data corresponding to a low level of the charge is outputted to the output terminal, and
when, after the charge is released, the second transistor and the first transistor are turned off and the third transistor is turned on, the output from the buffer is applied to one of the source and the drain of the first transistor.

8. A semiconductor device comprising:
a first transistor;
a second transistor;
a third transistor;
a capacitor; and
a buffer,
wherein one of a source and a drain of the second transistor is electrically connected to an input terminal,
wherein the other of the source and the drain of the second transistor is electrically connected to one of a source and a drain of the first transistor and one of a source and a drain of the third transistor at a first node,
wherein the other of the source and the drain of the first transistor is electrically connected to one electrode of the capacitor and an input of the buffer at a second node,
wherein the other electrode of the capacitor is electrically connected to a reference voltage terminal,
wherein an output of the buffer is electrically connected to an output terminal and the other of the source and the drain of the third transistor,
wherein the semiconductor device is configured so that
when the second transistor and the first transistor are turned on, a charge originating from the input terminal is accumulated in the capacitor, and data corresponding to the charge is outputted from the buffer to the output terminal, and
when, after the charge is accumulated, the second transistor and the first transistor are turned off and the third transistor is turned on, and an output from the buffer is applied to the one of the source and the drain of the first transistor, the charge is held in the capacitor, and
wherein the first node has a lower capacitance than the second node.

9. A semiconductor device according to claim 8, further comprising:
an antenna;
a rectifier circuit;
a logic portion; and
a flag holding circuit comprising the first transistor, the second transistor, the third transistor, the capacitor and the buffer,
wherein the logic portion includes a clock circuit, a logic circuit, a demodulation circuit, and a modulation circuit,
wherein the antenna is connected to the rectifier circuit,
wherein the rectifier circuit is connected to the logic portion and the flag holding circuit, and
wherein a gate of the first transistor, a gate of the second transistor, and a gate of the third transistor are electrically connected to the logic circuit.

10. A semiconductor device according to claim 8, wherein the semiconductor device is configured to prevent current leakage through the source and the drain of the first transistor by putting the first transistor and the second transistor in an off state and insuring connection between the output of the buffer and the one of the source and the drain of the first transistor when the first transistor and the second transistor are in the off state.

11. A semiconductor device according to claim 8, wherein the semiconductor device is configured to prevent current leakage of charges accumulated in the capacitor through the source and the drain of the first transistor when the first transistor is in the off state.

12. A semiconductor device comprising:
   a first transistor;
   a second transistor;
   a third transistor;
   a capacitor; and
   a buffer,
   wherein one of a source and a drain of the second transistor is electrically connected to an input terminal,
   wherein the other of the source and the drain of the second transistor is electrically connected to one of a source and a drain of the first transistor and one of a source and a drain of the third transistor at a first node,
   wherein the other of the source and the drain of the first transistor is electrically connected to one electrode of the capacitor and an input of the buffer at a second node,
   wherein the other electrode of the capacitor is electrically connected to a reference voltage terminal,
   wherein an output of the buffer is electrically connected to an output terminal and the other of the source and the drain of the third transistor,
   wherein the semiconductor device is configured so that:
      when the second transistor and the first transistor are turned on, a charge originating from the input terminal is accumulated in the capacitor, and data corresponding to the charge is outputted from the buffer to the output terminal, and
      when, after the charge is accumulated, the second transistor and the first transistor are turned off and the third transistor is turned on, and an output from the buffer is applied to the one of the source and the drain of the first transistor, the charge is held in the capacitor,
      when the second transistor and the first transistor are turned on, the charge accumulated in the capacitor is released to one of the source and the drain of the first transistor, and data corresponding to a low level of the charge is outputted to the output terminal, and
      when, after the charge is released, the second transistor and the first transistor are turned off and the third transistor is turned on, the output from the buffer is applied to the one of the source and the drain of the first transistor, and
   wherein the first node has a lower capacitance than the second node.

13. A semiconductor device according to claim 12, further comprising:
   an antenna;
   a rectifier circuit;
   a logic portion; and
   a flag holding circuit comprising the first transistor, the second transistor, the third transistor, the capacitor and the buffer,
   wherein the logic portion includes a clock circuit, a logic circuit, a demodulation circuit, and a modulation circuit,
   wherein the antenna is connected to the rectifier circuit,
   wherein the rectifier circuit is connected to the logic portion and the flag holding circuit, and
   wherein a gate of the first transistor, a gate of the second transistor, and a gate of the third transistor are electrically connected to the logic circuit.

14. A semiconductor device according to claim 12, wherein the semiconductor device is configured to prevent current leakage through the source and the drain of the first transistor by putting the first transistor and the second transistor in an off state and insuring connection between the output of the buffer and the one of the source and the drain of the first transistor when the first transistor and the second transistor are in the off state.

15. A semiconductor device according to claim 12, wherein the semiconductor device is configured to prevent current leakage of charges accumulated in the capacitor through the source and the drain of the first transistor when the first transistor is in the off state.

* * * * *